United States Patent [19]

Willis

[11] Patent Number: 4,713,610
[45] Date of Patent: Dec. 15, 1987

[54] ELECTRIC METER WITH IMPROVED SENSING HEAD ASSEMBLY

[75] Inventor: Thomas G. Willis, Raleigh, N.C.

[73] Assignee: Westinghouse Electric Corp., Pittsburgh, Pa.

[21] Appl. No.: 676,763

[22] Filed: Nov. 29, 1984

[51] Int. Cl.⁴ .............................................. G01R 11/02
[52] U.S. Cl. .............................. 324/157; 250/231 SE; 250/239; 324/96; 361/398; 361/419; 361/427
[58] Field of Search ........................ 324/96, 157, 142; 346/14 MR; 250/231 SE, 239; 340/870.02; 361/417, 419, 420, 427, 398

[56] References Cited

U.S. PATENT DOCUMENTS

| | | | |
|---|---|---|---|
| 3,397,929 | 8/1968 | Gill et al. | 308/10 |
| 3,413,550 | 11/1968 | Wright | 324/152 |
| 3,878,391 | 4/1975 | McClelland et al. | 250/233 |
| 3,943,498 | 3/1976 | McClelland et al. | 340/206 |
| 4,034,292 | 7/1977 | McClelland | 324/157 |
| 4,047,024 | 9/1977 | Henderson | 250/231 SE |
| 4,268,756 | 5/1981 | Crouse et al. | 250/239 X |
| 4,298,839 | 11/1981 | Johnston | 324/157 |
| 4,301,508 | 11/1981 | Anderson | 324/103 R X |
| 4,491,789 | 1/1985 | Benbow | 324/113 |
| 4,491,793 | 1/1985 | Germer et al. | 324/157 |
| 4,556,844 | 12/1985 | Wason | 324/156 |
| 4,584,527 | 4/1986 | Amigo | 324/157 |

Primary Examiner—Reinhard J. Eisenzopf
Assistant Examiner—Stephen M. Baker
Attorney, Agent, or Firm—B. R. Studebaker

[57] ABSTRACT

An improved sensing head structure is provided that utilizes a flexible means for supporting a plurality of electronic components. A bracket is provided that supports the flexible support means in a preselected configuration and also provides a retaining clip portion that fastens a sensing head to the bracket. The bracket is attached to a frame portion of an electric meter in order to support the sensing head at a known position for sensing the passage of a non-reflective band on a rotatable disc under it. The use of two sensing heads permits the rotations of the rotatable disc to be counted and thus provides an apparatus for measuring electrical energy consumption. A spacer bar is also provided for the purposes of allowing the present invention to be utilized to more easily retrofit electric meters having rotatable discs of different sizes and positions within the meter.

13 Claims, 17 Drawing Figures

ELECTRIC METER WITH IMPROVED SENSING HEAD ASSEMBLY

BACKGROUND AND SUMMARY OF THE INVENTION

The present invention relates generally to electric meters and, more specifically, to an electric meter with an apparatus for supporting and positioning a sensing head for use with a photo-optic pulse initiator.

Electric utility companies have, for many years, used electric meters to measure the electric energy consumption of its customers. Many different types of electric meters have been used, such as kilowatt-hour meters, demand meters and time-of-use meters. A typical electric meter comprises a base member that can be attached to a portion of a consumer's dwelling. A frame structure is rigidly attached to the base for the purpose of supporting the internal components of the meter. Usually, the frame member is metallic and is shaped to receive a vertical shaft in rotatable association therewith. This vertical shaft is attached to a disc which is rotatable in response to electrical energy usage. This electroconductive disc, or armature, is typically mounted for rotation about the vertical axis of the shaft which is supported by one or more bearings. U.S. Pat. No. 3,397,929, which issued on Aug. 20, 1968 to Gill et al, discloses a bearing assembly that includes a stator unit and a rotor unit mounted for relative rotation. A magnetically supported shaft is disclosed in U.S. Pat. No. 3,413,550, which issued on Nov. 26, 1968 to Wright. It comprises a rotatable electroconductive armature and two damping magnet fields which vary in cross-section oppositely in a direction parallel to the armature axis. These two patents disclose bearings that provide support for the disc and vertical shaft in such a way so as to minimize friction between the stationary and rotating components.

In a typical application, an electric meter is provided with a dial register for visually indicating the cumulative energy consumption of an electric energy consumer. The front face of the register typically comprises a plurality of dials, or pointers, that rotate with shafts to which they are attached. The register generally has a plurality of rotatable shafts that are connected together, by appropriate gearing, in a decade relationship. The pointer and shaft that represent the least significant digit of the kilowatt-hour reading are associated, in a gearing relationship, with the vertical shaft of the rotatable disc. A worm gear portion of the vertical shaft engages appropriate transmission gearing that permits the vertical shaft to cause the entire gear train of the register to be affected in response to the consumer's electrical energy consumption.

Recent developments in the field of electric energy measurement have resulted in alternative measuring techniques which alleviate the need for a mechanical dial register as described above. These improved techniques relate to the use of electronic signals that are responsive to the rotation of the electric conductive disc itself. In a typical application of this type of meter, the rotatable disc is marked in such as way so as to provide both reflective and non-reflective portions on its surface. One or more sensing heads are disposed proximate the surface of the rotatable disc and are provided with light sources and light sensitive components. Each light source, such as a light emitting diode, is directed toward the surface of the disc in such a way so as to direct a beam of light at a preselected angle toward the surface. One or more light sensitive components, such as photodiodes or phototransistors, are each associated with a light emitting diode and disposed in such a way so as to receive reflected light from the surface of the disc. When a reflective portion of the disc surface passes proximate the sensing head, the light beam is reflected by the disc's surface and received by the photosensitive device. Alternatively, when a non-reflective surface passes proximate the sensing head, no light is reflected and appropriate electronic circuitry can be provided that distinguishes between the presence and absence of light. As the disc rotates, reflective and non-reflective portions of its surface sequentially pass beneath the sensing head and appropriate pulses can be generated in response to the changes from reflective to non-reflective states. This technique permits electronic circuitry to count the pulses and maintain a count of the number of revolutions of the rotatable disc. U.S. Pat. No. 4,034,292, which issued on July 5, 1977 to McClelland, discloses a direction sensitive opto-electronic pulse initiator for electrical meters. U.S. Pat. No. 4,047,024, which issued on Sept. 6, 1977 to Henderson, discloses a photoelectric pulse initiator that includes a single track pattern and sensing assembly. A direct input photoelectric pulse initiator for meter telemetry and recording systems is disclosed in U.S. Pat. No. 3,943,498 which issued on Mar. 9, 1976 to McClelland et al and an improved radiometric pulse initiator having a reflective pattern drum is disclosed in U.S. Pat. No. 3,878,391, which issued on Apr. 15, 1975 to McClelland et al.

When photoelectric sensing heads are used to count the rotations of the rotatable disc, mechanical registers can be replaced by improved indicator panels. For example, vacuum fluorescent display Style number LD8191/FIP9J5B made by the Nippon Electric Company can be used. Appropriate electronic circuitry is required to count the pulses received by the sensing head assembly and store the results in the memory of a microprocessor and associated random access memory (RAM) devices. After converting the pulse count to a kilowatt-hour value, by multiplication by an appropriate constant, the kilowatt-hour consumption can be stored and displayed on the indicating panel.

The present invention provides an apparatus that enables a conventional electromechanical meter, using a mechanical dial register, to be converted to a meter that utilizes a sensing head assembly and a pulse initiator to measure electrical energy consumption as a function of the number of rotations of a rotatable disc. This enables a conventional electric meter to be retrofitted to include electronic capabilities. By using the present invention, an operator can remove the mechanical register from an electric meter and replace it with a preassembled structure that contains all the required components to convert the meter to one which utilizes sensing heads, a photo-optic pulse initiator and a indicator panel. Furthermore, the present invention provides dimensionally accurate positioning of the sensing heads in relation to the rotatable disc in such a way that it is applicable to both single-phase and three-phase meters. The present invention utilizes the existing base, frame and armature structure of the existing meter along with all the stator conductors which remain rigidly attached to the base.

When sensing heads and pulse initiator are utilized to measure electrical energy consumption, special rotatable discs are usually employed. However, the present invention permits conventional electroconductive discs to be used. This avoids the necessity of replacing the vertical shaft and rotatable disc of the original meter along with the necessary recalibration that would otherwise be required.

The present invention comprises a frame member which is generally similar in appearance to the back plate of the conventional register with which it will be utilized. Attached to the frame member is a bracket. The present invention utilizes a flexible means for supporting the plurality of electronic components required to count pulses received from the above-mentioned sensing heads. The flexible supporting means, or flexible circuit, can be of the type that are available in commercial quantities from the Buckbee-Mears Company. This flexible means for supporting the electronic components comprises a plurality of conductive paths that are connected in electrical communication with the electronic components. The electronic components comprises resistors, capacitors and semiconductive devices. Furthermore, one or more microprocessors and related memory devices can be connected in electrical communication with the conductive paths of the flexible component supporting means.

The flexible circuit is supported by the bracket discussed above. The bracket is shaped to receive a portion of the flexible supporting means in sliding association and retain the circuit in such a way so as to prevent its movement after assembly. The bracket also has at least one retaining clip that is shaped to receive a sensing head. The sensing head is shaped to receive a first and a second device is a preselected alignment relation with each other. In a preferred embodiment of the present invention, the first device is a light source, such as a light emitting diode, and the second device is a light sensitive component, such as a phototransistor. The sensing head has two openings which are shaped to receive these devices and retain them in a preselected alignment relation. The particular alignment of the first and second devices is such that a light beam can be directed from the light emitting diode toward the surface of the rotatable disc of the electric meter. The second device is aligned in such a way so as to receive the reflected light beam from the surface of the rotatable disc.

In order to provide for the use of the present invention with different sizes of rotatable discs and different vertical positions of the rotatable discs, a spacer is provided in order to offset the position of the bracket and sensing heads from the back plate, or frame member, of the present invention.

The present invention provides an apparatus that permits a conventional electromagnetic meter to be retrofitted in the field with sensing heads, pulse initiators and related circuitry. Furthermore, the present invention can be used to manufacture improved electric meters, prior to delivery and installation in the field.

BRIEF DESCRIPTION OF THE DRAWING

The present invention will be more fully understood from a reading of the description of the preferred embodiment in conjunction with the drawing, in which.

DESCRIPTION OF THE PREFERRED EMBODIMENT

Figure 1:
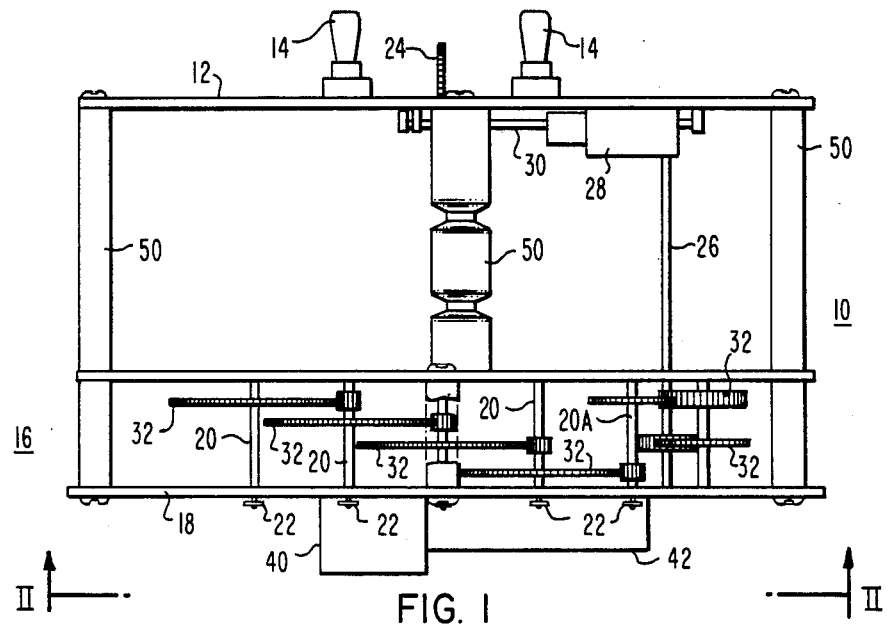
FIG. 1 illustrates the frame structure of the present invention with a mechanical register combined with an electronic demand register attached thereto.

Throughout the description of the preferred embodiment, like components will be referred by the same reference numerals.

FIG. 1 illustrates a support structure 10 suitable for use with the present invention. It comprises a backplate 12 with two extensions 14 that permit the support structure 10 to be rigidly attached to the base structure of an electric meter. Attached to the support structure 10 is a mechanical register 16 that has a front plate 18 with a plurality of rotatable shafts 20 extending therethrough. Each of the rotatable shafts 20 has an indicator, or pointer 22, attached thereto. The rotatable shaft 20A that is associated with the pointer 22 of the least significant digit of the electric meter register 16 is associated, by appropriate gearing, to a worm wheel gear 24. This gearing comprises a rotatable shaft 26 which extends from the register 16 toward the backplate 12. Transmission gearing, contained within the box 28, provides the necessary gears which enable the rotatable shaft 26 to rotate in response to the rotation of shaft 30 which is attached to the wormwheel gear 24. Therefore, rotation of the wormwheel gear 24 causes the shaft 20A of the least significant digit of the electric meter to rotate. The other rotatable shafts 20 are connected together, and to shaft 20A, by gears 32 whose sizes are chosen, by methods known to those skilled in the art of register design, to relate the shafts 20 together in a decade relationship.

Figure 2:
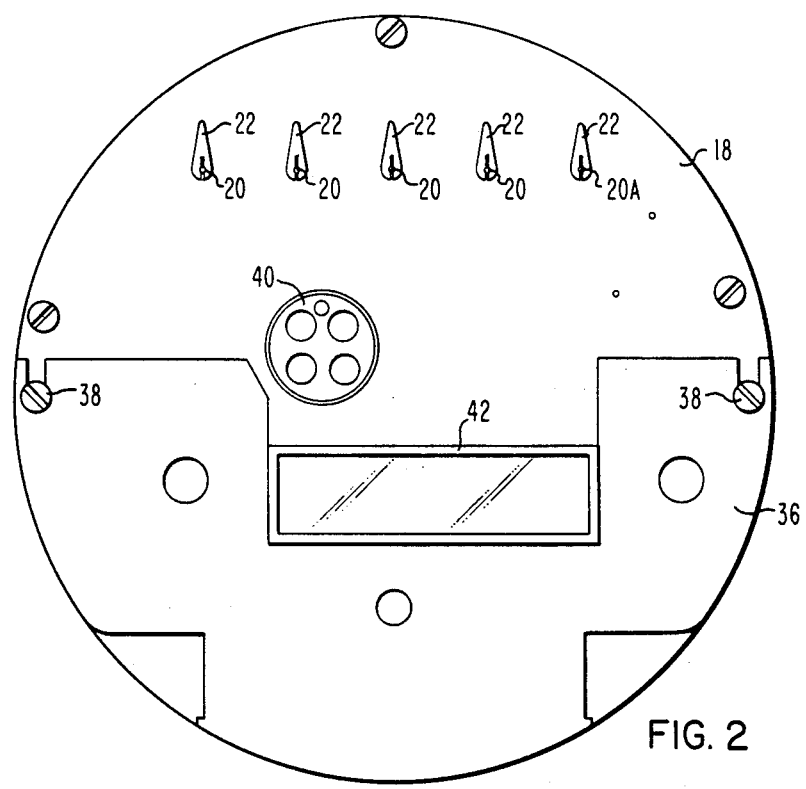
FIG. 2 illustrates a front view of a proposed mechanical register combined with an electronic demand register.

FIG. 2 is a front view of the apparatus of FIG. 1. It comprises a front plate 18 through which a plurality of shafts 20 extend. Each shaft is attached to a pointer 22 that rotates about the centerline of its associated shaft. In a typical application, a plurality of indicia (not illustrated in FIG. 2) are disposed on the front plate 18 about the centerline of each shaft 20. The cumulative electrical energy consumption of an electric consumer is thus indicated by the relative positions of the pointers 22 with respect to these indicia. As discussed above, shaft 20A and its associated pointer 22 would represent the least significant digit of the cumulative electrical energy reading.

Other components illustrated in FIG. 2, which are not directly related to the present invention, include a faceplate 36 that is attachable by screws 38 to the front plate 18 for the purpose of carrying information relating to the electrical meter on its face. A communications device 40 is illustrated in FIG. 2 extending from the front plate 18. The purpose of this communication device 40 is to permit a meter reader, or operator, to automatically transmit and receive messages between the electric meter and a hand-held communications device. An indicator panel 42 is disposed relative to the front plate 18 in such a way so as to be readable from a position in front of the associated electric meter.

Figure 3:
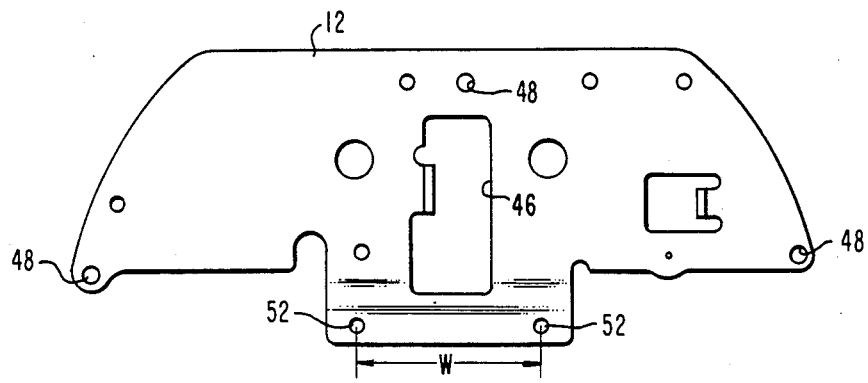
FIG. 3 illustrates the back plate of the present invention which provides a frame structure to support its other components.

FIG. 3 illustrates the backplate 12 of the present invention. It serves as a frame member on which the other components of the present invention can be supported. In FIG. 3, the backplate 12 is shown having a plurality of holes and openings therethrough. Only those openings that are directly related to the present invention will be described herein. As can be seen in FIGS. 1 and 3, opening 46 permits the wormwheel gear 24 to extend through the backplate 12. The portion of the wormwheel gear 24 that extends behind the backplate 12 is engaged with a wormgear portion of a vertical shaft that supports the rotatable disc of an electric meter. The front portion of the wormwheel gear 24 extends toward the front portion of the backplate 12 and is engaged with shaft 30 and the related gears and shafts that connect the wormwheel gear 24 to the shaft 28 of the least significant digit of the electric meter. Holes 48 permit the back plate 12 to be rigidly attached to a plurality of posts 50 for the purposes of attaching the mechanical dial register 16 to the backplate 12. It should be understood that the mechanical dial register 16 is not a requirement of the present invention. Instead, in this particular embodiment of the present invention, the mechanical register 16 provides a redundant visual indication of electrical consumption. Holes 52 in the backplate 12 are provided for attachment of a bracket of the present invention to the backplate 12. They are spaced apart by a distance W which is chosen to match the distance W between the holes in the bracket and spacer members of the present invention (illustrated in FIGS. 7 and 8 and discussed below).

The backplate 12 provides a support frame for the present invention. As shown in FIG. 1, the back portion of the backplate 12 (not illustrated in FIG. 3) has two extensions 14 attached to it. These extensions 14 are shaped to be received by associated portions of the meter base structure for purposes of rigidly attaching the present invention thereto in a manner well known to those skilled in the art of electrical meter design.

Figure 4A:
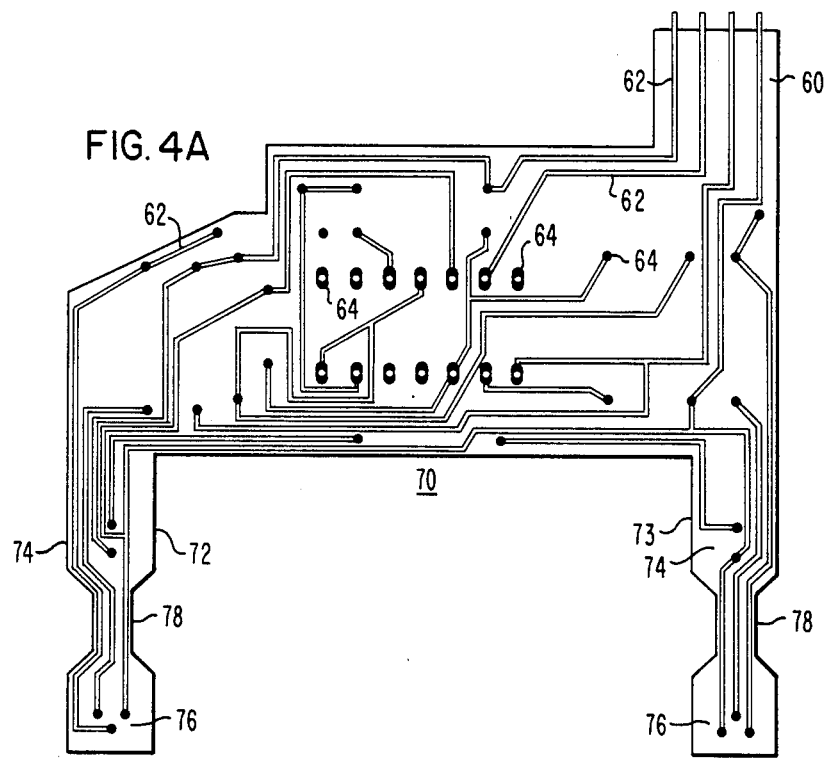
FIG. 4A illustrates a flexible circuit which provides a means for supporting a plurality of electronic components.

FIG. 4A illustrates the flexible means for supporting a plurality of electrical components in conjunction with the present invention. It comprises a flexible substrate 60 on which a plurality of conductive paths 62 are disposed. These conductive paths provide electrical communication between a plurality of circuit points, or pads. The pads 64 are disposed on the substrate 60 at positions that are preselected to receive electrical components. During assembly of the electrical components, their leads are inserted through holes at each of the pads 64 and electrically connected to the conductive paths 62. The flexible supporting means 70 is shaped to have first 72 and second 73 extensions. Each of these extensions is provided with a location for the attachment of a light emitting diode. These locations are indicated by reference numeral 74. Each of the extensions, 72 and 73, is also provided with a location for attachment of a photosensitive device, such as a phototransistor. These locations are indicated in FIG. 4A by reference numeral 76. The two pads at each of the light emitting diode locations 74 are connected in electrical communication with the pads 64 of the remaining circuitry of the component supporting means 70. Similarly, each of the phototransistor locations 76 is also connected at appropriate pads 64 in electrical communication with portions of the circuit.

A portion of each extension, 72 and 73, is narrowed as illustrated in FIG. 4A. These narrowed portions are indicated by reference numeral 78. When assembled with the other components of the present invention, the supporting means 70 is bent at regions 78 in order to permit a light emitting diode and a phototransistor to be more easily aligned in a preselected angular relationship with each other and inserted into respective openings in a sensing head (discussed in greater detail below and illustrated in FIGS. 9B, 10, 11, 13, 14A and 14B).

Figure 4B:
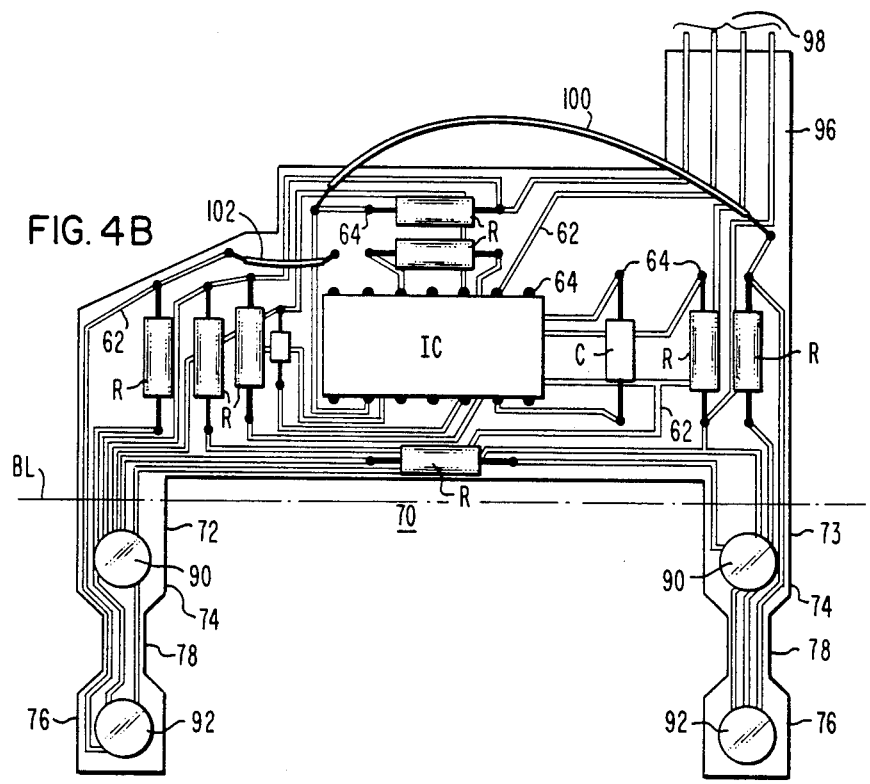
FIG. 4B illustrates the flexible circuit of FIG. 4A along with a plurality of electronic components.

FIG. 4B illustrates the supporting means 70 of FIG. 4A along with a plurality of components connected to the pads 64 and interconnected to each other by the conductive paths 62. It should be understood that the particular components can differ significantly in different embodiments of the present invention. For illustration purposes only, the supporting means 70, with its associated electronic components, is illustrated in FIG. 4B. In a typical application of the present invention, a plurality of resistors R, capacitor C and integrated circuits IC are attached to the pads 64 and connected in electrical communication with preselected conductive paths 62. In this way, an electrical circuit can be provided that performs the required functions, in conjunction with the light emitting diodes 90 and phototransistors 92, of counting pulses that are related to the revolutions of a rotating disc within an electric meter. As can be seen in FIG. 4B, the light emitting diodes 90 are connected to the pads 64 at location 74 and the phototransistors 92 are connected to the pads 64 at locations 76.

The supporting means 70 illustrated in FIG. 4B also has a third extension 96 which provides support for four specific ones of the plurality of conductive paths 62. This extension 96 supports the conductive paths which will be connected in electrical communication with other components of an electric meter. For example, if an electronic display is utilized in conjunction with the present invention, the required signals will be transmitted to the indicator panel and its associated components on the conductive paths which terminate at leads 98. For purposes of illustration only, two jumpers, 100 and 102, are also illustrated in FIG. 4B to demonstrate possible optional connections between pads 64 other than those connections provided by the conductive paths 62. It should be understood that the particular circuits illustrated in FIG. 4B, and the components connected thereto, are only for illustration purposes and do not limit the scope of the present invention. Many other types of circuits and choices of components are within the scope of the present invention.

Figure 5:
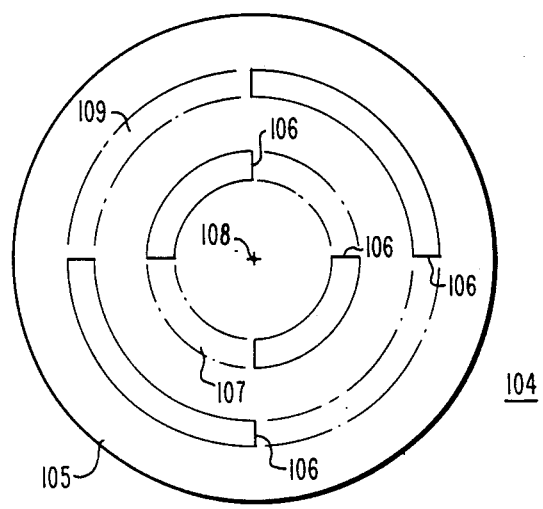
FIG. 5 illustrates the type of rotatable disc normally used with sensing heads and pulse initiators.

As discussed above, when pulse initiators and sensing heads are used in conjunction with an electric meter, special rotating discs are usually provided. The disc 104 illustrated in FIG. 5 is a typical example of the type of disc generally used for these purposes. It comprises a generally non-reflective surface 105 with a plurality of reflective bands 106 disposed thereon. As the disc 104 rotates about its center 108, the reflective bands 106 rotate about the center 108. The particular example illustrated in FIG. 5 would represent a disc 104 that is to be associated with two sensing heads. One sensing head would be associated with the inner bands 106 which are more closely disposed toward the center 108 at circular path 107 and another sensing head would be associated with the outer bands 106 which are disposed further outward from the center of rotation 108 at circular path 109. It should be understood that the disc illustrated in FIG. 5 is exemplary for purposes of showing the basic techniques relating to sensing heads, pulse initiators and specially designed rotating discs.

Figure 6:
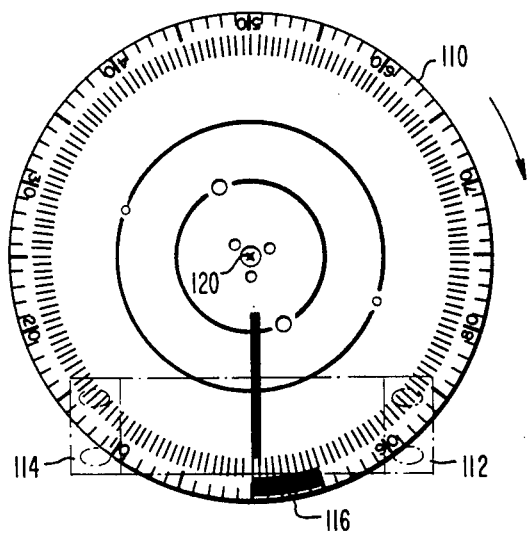
FIG. 6 illustrates a conventional rotatable disc that can be used in conjunction with the present invention.

FIG. 6 illustrates a standard rotatable disc 110 that is well-known to those skilled in the art of electrical metering. Its dimensions and appearance are determined by industry standards. The present invention is designed to take advantage of the marking on the standard rotatable disc 110. More specifically, two sensing heads, 112 and 114, are disposed proximate the periphery of the disc 110 at locations under which a non-reflective band 116 of the standard disc 110 passes. As the disc 110 rotates about its center 120, in the direction indicated by the arrow in FIG. 6, the non-reflective band 116 will pass sequentially under sensing head 112 and then under sensing head 114. When this non-reflective band 116 passes under sensing head 112, the lack of light beam reflection received by the phototransistor of the present invention will indicate this occurrence and relay this information to its associated circuitry. Later, when the non-reflective band 116 passes under sensing head 114, another similar indication will be received and the combination of these two sequential occurrences will indicate the rotation of the disc 110. Upon each sequential occurrence of this combined situation, a single rotation of the disc 110 will be recorded. It should be understood that, in FIG. 6, the sensing heads, 112 and 114, and their related support structure is indicated by phantom lines for the specific purpose of illustrating the exemplary locations of the sensing heads, 112 and 114, with respect to the rotatable disc 110. The sensing heads and their associated support structure will be illustrated and described in greater detail below.

Figure 7:
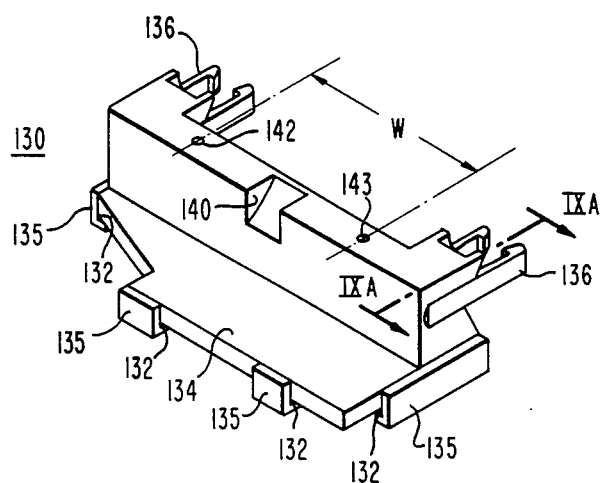
FIG. 7 illustrates the bracket of the present invention.

FIG. 7 illustrates a bracket 130 which is shaped to receive the flexible support means 70 and prevent its movement with relationship to the other components of an electric meter after assembly. The bracket 130 has a plurality of channels 132 which are shaped to permit the flexible support means 70 to pass within them and be retained against a platform portion 134 of the bracket 130. Extensions 135 are provided to form the channels 132 between themselves and the underside of platform 134.

The bracket 130, as illustrated in FIG. 7, is also provided with two retaining clips 136 which are each shaped to receive individual sensing heads. The relationship between the retaining clips 136 and the sensing heads will be described in greater detail below. The bracket 130 is also provided with a slot 140 which is shaped to provide clearance between the bracket 130 and the wormwheel gear 24 of an electric meter after assembly. Two holes, 142 and 143, are provided in the bracket 130 for purposes of attaching the bracket 130 to the backplate 12.

Figure 8:
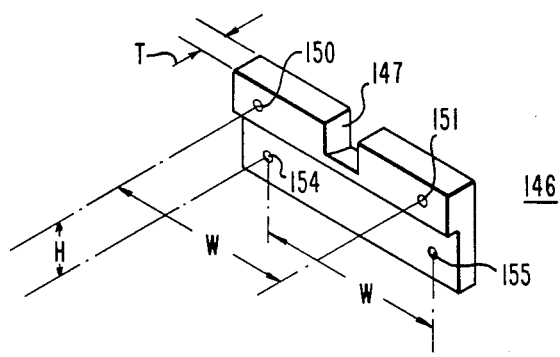
FIG. 8 illustrates the spacer of the present invention.
Figure 9A:
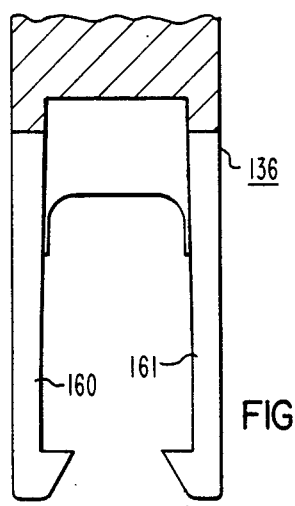
FIG. 9A illustrates the retaining clip portion of the bracket of the present invention.

FIG. 8 illustrates a spacer 146 which can be used to provide a preselected offset between the bracket 130 and the backplate 12. For example, if the present invention is to be used in conjunction with meters that have different size rotatable discs 110, the spacer 146 can provide the dimensional offset required for use with two different sizes of discs. The distance W between the holes, 150 and 151, and between the holes, 154 and 155, is the same distance as that between the holes, 142 and 143, of the bracket 130 as illustrated in FIG. 7. The distance H between the holes, 150 and 154, is chosen to offset the bracket 130 by a specific distance in order to permit the present invention to be used with both single-phase and three-phase electrical meters which, in some particular applications, incorporate rotatable discs that are at different heights with respect to the extensions 14 that are attached to the backplate 12. Similarly, dimension T of the spacer 146 is chosen to offset the present invention away from the backplate 12 by an amount equal to the difference in required distance between the sensing heads and the backplate 12. The relationship between the spacer 146, the bracket 130 and the backplate 12 will be described in greater detail below. FIG. 9A illustrates a sectional view of a retaining clip 136 of the present invention. Each retaining clip 136 of the present invention comprises two fingers, 160 and 161, which are shaped to receive a sensing head and latch the sensing head into a preselected position relative to the bracket 130. The fingers, 160 and 161, are shaped to exhibit a degree of flexibility that permits the sensing head to be inserted between their distal ends and spread them apart during insertion. After insertion of a sensing head into the retaining clip 136, the fingers will spring back into position and retain the sensing head at its preselected location.

Figure 9B:
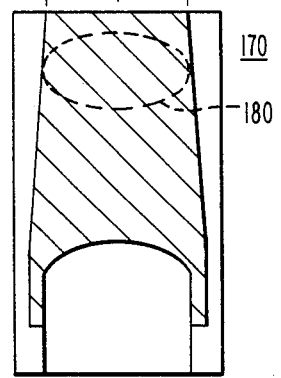
FIG. 9B illustrates a cross sectional view of the sensing head of the present invention.

FIG. 9B illustrates a sectional view of a sensing head 170. FIGS. 9A and 9B, taken together, illustrate the physical relationship between the sensing head 170 and the retaining clip 136 prior to insertion of the sensing head 170 between the fingers, 160 and 161. The sensing head 170 would be pushed in the direction indicated by the arrow until the fingers are spread apart to capture the sensing head 170 by the hook portion of each of the distal ends of the fingers, 160 and 161, of the retaining clip 136.

Figure 10:
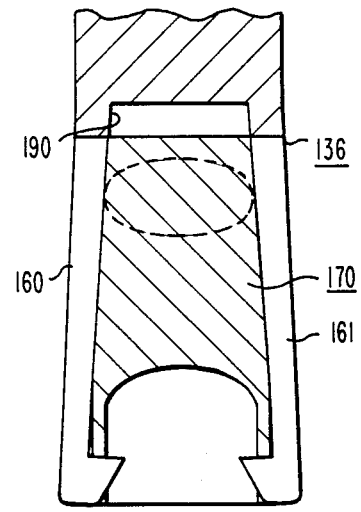
FIG. 10 illustrates the sensing head of the present invention attached to the retaining clip portion of the bracket of the present invention.

FIG. 10 illustrates a sensing head 170 retained by the fingers, 160 and 161, of a retaining clip 136. It should be apparent from FIG. 10 how the hook portion of each of the distal ends of the fingers prevent the sensing head 170 from moving away from the retaining clip 136 or its associated bracket 130.

Figure 11:
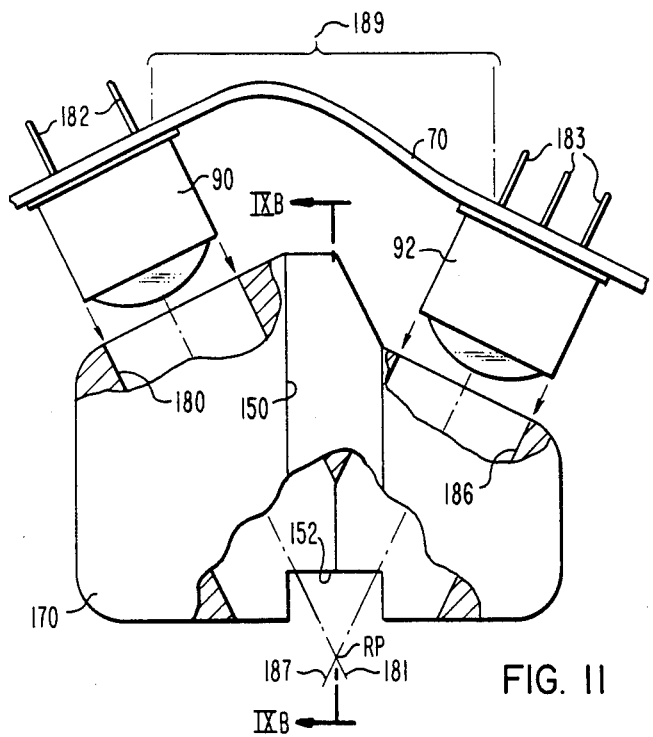
FIG. 11 illustrates the sensing head of the present invention in conjunction with a portion of the flexible supporting means with a light emitting diode and a phototransistor connected thereto.

FIG. 11 illustrates a sensing head 170 in association with the flexible support means 70 and two electronic devices connected to the flexible support means. One of the electronic components, the light emitting diode 90, is illustrated in FIG. 11 in a position prior to insertion into a first opening 180 of the sensing head 170. The first opening 180 is shaped to receive the light emitting diode 90 and maintain the alignment of the light emitting diode 90 along line 181. The two arrows proximate the light emitting diode 90 indicate the direction of travel of the light emitting diode during insertion into the opening 180 of the sensing head 170. The leads 182 of the light emitting diode 90 are shown in FIG. 11 extending through the flexible support means 70. These leads 182 extend through holes at the pads 64 of the flexible support means 70 at location 74 (illustrated in FIG. 4A). After insertion, the leads 182 of the light emitting diode are connected in electrical communication with the conductive paths 62 by soldering or some other appropriate process.

Also shown in FIG. 11 is the phototransistor 92. The phototransistor 92 is shown with its leads 183 extending through the flexible support means 70. These leads 183 are also connected in electrical communication with the conductive paths 62 by soldering or some other appropriate process. The sensing head 170 is provided with a second opening 186 that is shaped to receive the phototransistor 92 and align the phototransistor along line 187.

The flexibility of the support means 70 permits the electronic components, 90 and 92, to be presoldered to it and, subsequently, inserted into the openings, 180 and 186, of the sensing head 170. This flexibility permits the light emitting diode 90 and phototransistor 92 to be pushed, in the direction of the arrows in FIG. 11, into their respective openings. It should be understood that, during this assembly process, the light emitting diode 90 and phototransistor 92 will be closer together than they are prior to assembly. Therefore, the portion 189 of the flexible support means 70 between these components will form a bend that is slightly more acute than the one illustrated in FIG. 11. This bending, or buckling, permits easier assembly of the components into the sensing head. Referring again to FIG. 10, a space 190 is provided in the retaining clip portion 136 of the bracket 130 in order to provide for this bending, or buckling, of the portion 189 of the flexible support means 70 between the light emitting diode 90 and phototransistor 92.

Referring again to FIG. 11, it should be noted that the two electronic components, 90 and 92, are aligned in such a way that their lines, 181 and 187, cross at a reflection point RP. Therefore, if a light beam generated by the light emitting diode 90 passes along line 181, a reflective surface horizontally disposed at the reflection point RP will cause the light beam to reflect along line 187 and be received by the phototransistor 92. Of course, it should be understood that the reflective surface must be disposed at an angle which is perpendicular to a vertical line bisecting the angle between lines 181 and 187.

Figure 12:
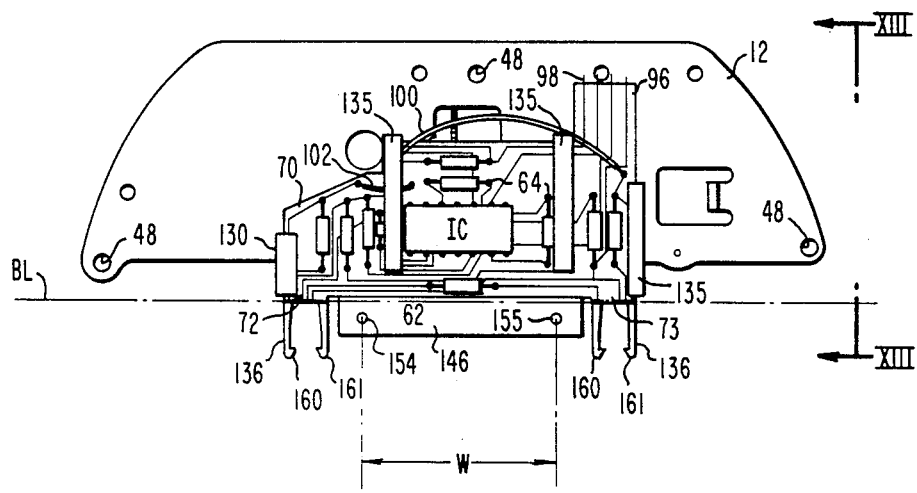
FIG. 12 illustrates the backplate of the present invention along with its bracket and flexible electronic component supporting means.

FIG. 12 illustrates the bracket 130 and spacer 146 attached to a backplate 12. A flexible support means 70 is shown inserted in the channels 132 of the bracket 130. Furthermore, a plurality of electronic components, such as the resistors R and the integrated circuit IC, are shown in FIG. 12 connected to the pads 64 and conductive paths 62 of the support means 70. For purposes of more clearly relating FIGS. 4B and 12, a bend line BL is shown in both drawings to illustrate the specific assembly of the flexible support means 70 and the bracket 130. The portion of the lower extensions, 72 and 73, of the flexible support means 70 that extends into the retaining clip 136 portion of the bracket 130, bends in such a way so as to permit it to pass through the retaining clip 136 and further permit its electronic components, such as the light emitting diode 90 and phototransistor 92 (illustrated in FIG. 11) to be inserted into a sensing head 170 (not illustrated in FIG. 12). It should be apparent that bending the support means 70 along bend line BL will permit portions, 74 and 76, of the extensions, 72 and 73, to be disposed within the retaining clips 136.

Figure 13:
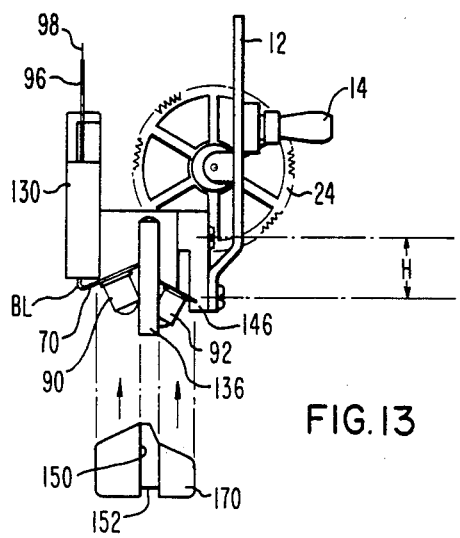
FIG. 13 is a side view of the structure illustrated in FIG. 12.

FIG. 13 is a side view of the present invention as illustrated in FIG. 12 with a sensing head 170 added for purposes of showing the relative position of these components prior to assembly of the sensing head 170 into the retaining clip 136. In FIG. 13, the bracket 130 is shown attached to the backplate 12 with the spacer 146 therebetween. It should be apparent that if the bracket 130 was attached directly to backplate 12, without the spacer 146, the entire assembly of the bracket, and its attached parts, would be positioned at a location that is lower, with respect to the backplate 12, by a distance H as indicated in FIG. 13. The distance H, as also illustrated in FIG. 8, represents the vertical distance between holes 150 and 154 and between holes 151 and 155. Therefore, it should be apparent that the spacer 146 provides an offset, with respect to the backplate 12, that is equal to the distance H. It should also be apparent from FIG. 13 that the spacer 146 disposes the bracket 180 at a distance T (shown in FIG. 8) further away from the backplate 12 than would occur if the spacer 146 were not disposed between the bracket 130 and the backplate 12. The purpose of these offsets will be described in greater detail below. Comparing FIGS. 7, 8 and 13, the function of grooves 140 and 147 should be apparent. They provide a clearance for the wormwheel gear 24 to prevent interference between it and the bracket 130 and spacer 146.

In FIG. 13, the light emitting diode 90 and the phototransistor 92 are shown connected to the flexible support means 70. Although the flexible support means 70 is shown in a bent condition with the light emitting diode 90 and the phototransistor 92 located at their final assembled position, it should be understood that the flexible support means 70 would be moved away from the retaining clip 136 during the actual assembly of the light emitting diode 90 and phototransistor 92 into their associated openings in the sensing head 170. Comparing FIGS. 4B and 13, the function of the bend line BL can be more fully understood. The flexibility of the flexible support means 70 permits it to change directions and accommodate the shapes of the retaining clip 136 and the sensing head 170.

The sensing head 170, after assembly of the light emitting diode 90 and phototransistor 92 into its associated openings, would be pushed upward into the retaining clip 136 with the fingers of the retaining clip being aligned with the slot 150 of the sensing head 170 as indicated by the arrows in FIG. 13. After the sensing head 170 is snapped into position in association with the bracket 130, the distal ends of the fingers of the retaining clip 136 will exert a force against a portion 152 of the slot 150 in the sensing head 170 and, therefore, will retain it in this position.

Figure 14:
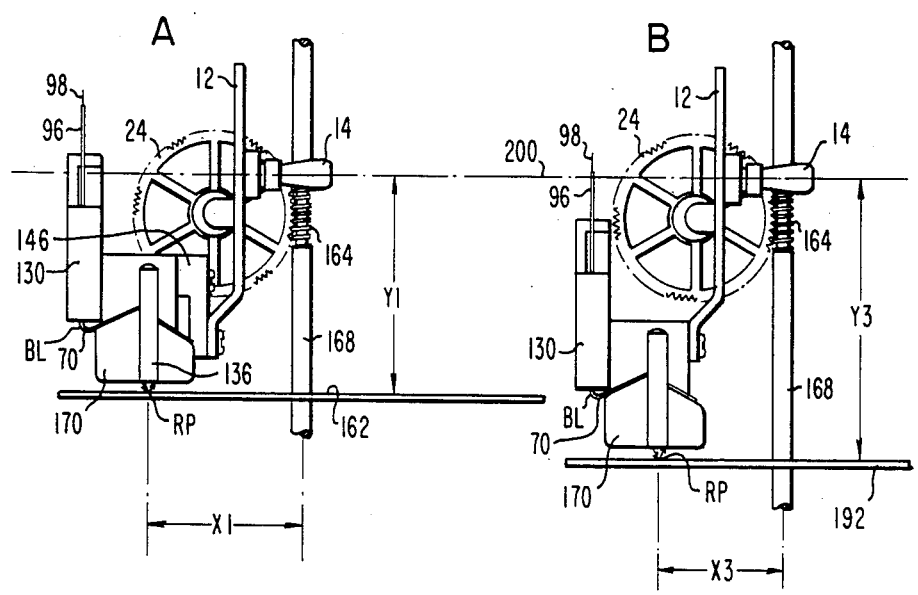
FIG. 14A is a side view of the present invention associated with the vertical support shaft and rotatable disc of a single phase electric meter.
FIG. 14B illustrate a side view of the present invention associated with the vertical shaft and rotatable disc of a three-phase electric meter.

FIGS. 14A and 14B illustrate the use of the present invention in conjunction with a single phase meter and a three-phase meter, respectively. In FIG. 14A, the backplate 12 and its associated wormwheel gear 24 are shown disposed proximate a vertical shaft 168 of an electric meter. The vertical shaft is attached to an exemplary rotatable disc 162 in such a way as is familiar to those skilled in the art of electrical metering. The rotatable disc 162 is caused to rotate by the electromagnetic forces incumbent during the use of electrical energy by the consumer. As the disc 162 rotates, its attached vertical shaft 168 also rotates. A threaded portion 164 of the vertical shaft 160 forms a wormgear that is engaged with the teeth of the wormwheel gear 24.

The sensing head 170 is disposed at a location relative to the disc 162 where the non-reflective band 116 (illustrated in FIG. 6) can pass under the reflection point RP of lines 181 and 187 (as illustrated in FIG. 11). It should be understood that the rotatable disc 162 is provided with a pattern similar to the pattern illustrated in FIG. 6 in conjunction with exemplary rotary disc 110.

The incident and reflected light beams are illustrated by the arrows in FIG. 14A along with the reflective point RP. Extension 96 of the flexible support means 70 extends upward from the bracket 130 for the purposes of providing a portion of the circuit that can be connected in electrical communication with external devices, such as microprocessors and indicating panels.

FIG. 14B illustrates an alternate application of the present invention that does not use the spacer 146. The sensing head 170 is associated with a rotatable disc 192. This disc is attached to a vertical shaft 168 that has a threaded portion 164. As discussed above in relation to FIG. 14A, the vertical shaft 168 of FIG. 14B is caused to rotate and its threaded portion 164, or wormgear, is engaged with the teeth of the wormwheel gear 24. The main difference between FIG. 14A and FIG. 14B is that their respective discs have different diameters and are disposed at different distances with respect to the extensions 14 that are attached to the backplates 12. Although meters made by different meter manufacturers will naturally differ in detail from each other, single-phase and three-phase meters made by the same manufacturer can also differ significantly in dimension and distances between associated components within the meter. FIGS. 14A and 14B illustrate how the present invention provides for adaptation to these different dimensions. For example, FIGS. 14A and 14B illustrate how these dimensions can vary. For example, dimensions Y1 and Y3 illustrate the different distances between the surfaces of the discs and the line 200 extending through the extensions 14 of an electric meter. Distance Y3 is shown as being greater than distance Y1. The difference between these dimensions is equal to distance H of the spacer 146 illustrated in FIG. 8. This shows one of the functions of the spacer 146. It is used to raise the sensing head 170 by a distance H appropriate to adjust for the decreased distance Y1 as compared to a three-phase meter with a distance Y3 between its disc 192 and a line 200 passing through the extension 14. The use of the spacer 146, as illustrated in FIG. 14A, provides a constant distance between the sensing head 170 and the surface of an associated rotatable disc.

The distance between the centerline of rotation of the vertical shaft 168 and a point at which the non-reflective band 116 passes under the sensing head 170 is illustrated as X1 in FIG. 14A and as X3 in FIG. 14B. The difference between these distances is a function of the difference between the diameters of single-phase and three-phase rotatable discs. In order to position the reflective point RP at a proper distance from the centerline of the vertical shaft 168, the spacer 146 is shaped with a thickness dimension T (illustrated in FIG. 6) that offsets the bracket 130 and sensing head 170 by a magnitude that is equivalent to the difference between X1 and X3.

Throughout the description of the preferred embodiment, many particular examples have been used to illustrate the structure and operation of the present invention. However, it should be understood that the particular shapes used in this preferred embodiment should not be considered to limit the present invention. In its simplest form, the present invention comprises a bracket 130 that performs two functions. Its first function is to maintain the flexible support means 70, along with its associated electronic components, at a constant position during the operation of the associated meter. Its second function is to provide a means for supporting the sensing head 170. This second function is accomplished by providing the bracket 130 with one or more retaining clip portion 136.

The flexible support means 70 permits the circuitry disposed thereon to be positioned conveniently during and after assembly. The flexible nature of this material 60 permits the light emitting diodes and phototransistors of the present invention to be inserted into associated openings in the sensing head 170.

The spacer 146 of the present invention is not a requirement for its use. Instead, it provides an alternative embodiment that permits the basic structure of the bracket 130 to remain unchanged even though the disc size and position may change for different styles and types of electric meters.

It should be clearly understood that the components and related circuitry, such as the positions of the pads 64 and conductive paths 62 illustrated herein are not a requirement of the present invention. Many different types of circuit configurations are possible for use with the present invention.

The sensing head apparatus of the present invention permits a sensing head to be disposed at a known preselected location with respect to the backplate of an electric meter. It also provides a simple but reliable structure for retaining both the sensing head and its related circuitry and for positioning the sensing head at a precise location with respect to a rotatable disc of an electric meter. The preferred embodiment of the present invention has been described with significant specificity and has been illustrated as being shaped in a particular configuration. However, it should be understood that the present invention is not limited to these particular shapes and configurations and other alternative embodiments should be considered to be within its scope.

What I claim is:

1. A meter apparatus, comprising:
   a frame member;
   a means for supporting a plurality of electronic components, said support means being flexible and generally non-conductive with a plurality of conductive paths connecting said electronic components;
   a bracket rigidly supported by said frame member, said bracket being shaped to retain a portion of said flexible support means, said bracket having at least one retaining clip; and
   a sensing head shaped to be received in said retaining clip, said sensing head being shaped to receive a first device and a second device in a preselected angular relation, said first and second device each being mounted to said supporting means in electrical communication with preselected ones of said plurality of conductive paths.

2. The apparatus of claim 1, wherein:
said first device is a light generating component and said second device is a light sensitive component.

3. The apparatus of claim 2, wherein:
said light generating component is a light emitting diode.

4. The apparatus of claim 2, wherein:
said light sensitive component is a photodiode.

5. The apparatus of claim 2, wherein:
said light sensitive component is a phototransistor.

6. The apparatus of claim 1, further comprising:
a spacer disposed between said frame member and said supporting means.

7. The apparatus of claim 6, wherein:
said spacer is shaped to offset the position of said sensing head relative to said frame member.

8. A meter, comprising:
a base portion;
a frame member rigidly attached to said base portion;
a bracket supported by said frame member;
means for supporting a plurality of electronic components, said supporting means being flexible and generally non-conductive, said supporting means having a plurality of conductive paths, said plurality of conductive paths providing electrical communication between predetermined ones of said plurality of electronic components, said supporting means being retained by a portion of said bracket;
a sensing head shaped to receive a light generating component and a light sensing component in preselected angular relation with each other, said light generating component and said light sensing component being mounted to said supporting means in electrical communication with preselected ones of said plurality of electronic components; and
means attached to said bracket for retaining said sensing head in a predefined position relative to said frame member, said retaining means being shaped to receive said sensing head in locking relation with said bracket.

9. The meter of claim 8, wherein:
said light generating component is a light emitting diode.

10. The meter of claim 8, wherein:
said light sensing component is a phototransistor.

11. The meter of claim 8, further comprising:
means disposed between said bracket and said frame member for spacing said bracket and said frame member apart by a preselected distance.

12. The meter of claim 8, wherein:
said sensing head is plastic.

13. The meter of claim 8, wherein:
said retaining means comprises two extensions; and
said sensing head has a pair of grooves shaped to fit between said two extensions in interference relation therewith.

* * * * *